(12) United States Patent
Rana et al.

(10) Patent No.: US 12,027,582 B2
(45) Date of Patent: Jul. 2, 2024

(54) IC STRUCTURE INCLUDING POROUS SEMICONDUCTOR LAYER UNDER TRENCH ISOLATION

(71) Applicant: GlobalFoundries U.S. Inc., Malta, NY (US)

(72) Inventors: Uzma B. Rana, Slingerlands, NY (US); Steven M. Shank, Jericho, VT (US); Anthony K. Stamper, Burlington, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 357 days.

(21) Appl. No.: 17/450,003

(22) Filed: Oct. 5, 2021

(65) Prior Publication Data

US 2023/0108712 A1 Apr. 6, 2023

(51) Int. Cl.
*H01L 29/06* (2006.01)
*H01L 23/66* (2006.01)
(Continued)

(52) U.S. Cl.
CPC .......... *H01L 29/0653* (2013.01); *H01L 23/66* (2013.01); *H01L 27/088* (2013.01); *H01L 27/1203* (2013.01)

(58) Field of Classification Search
CPC ......... H01L 29/66772; H01L 29/78654; H01L 29/0649–0653; H01L 29/7846; H01L 29/0642–0649; H01L 29/04–045; H01L 29/16–1608; H01L 29/18–185; H01L 29/22–2206; H01L 29/36–365; H01L 23/66; H01L 27/1203–1211; H01L 27/1463; H01L 27/092–0928; H01L 27/11807; H01L 21/26533; H01L 21/76243; H01L 21/823481; H01L 21/823878; H01L 21/76264; H01L 21/76289; H01L 21/764;
(Continued)

(56) References Cited

U.S. PATENT DOCUMENTS 5,723,896 A * 3/1998 Yee .................... H01L 21/26506
257/E21.564
6,627,507 B2 9/2003 Yuan
(Continued)

FOREIGN PATENT DOCUMENTS

EP 0116702 A2 * 8/1984

OTHER PUBLICATIONS

Chase Gene, "Ohms per square what!", 2008, ETS Inc, ESD Journal, p. 1 (Year: 2008).*
(Continued)

*Primary Examiner* — Cuong B Nguyen
*Assistant Examiner* — Anthony A Pulatov
(74) *Attorney, Agent, or Firm* — Anthony Canale; Hoffman Warnick LLC

(57) ABSTRACT

An integrated circuit (IC) structure includes an active device over a bulk semiconductor substrate, and an isolation structure around the active device in the bulk semiconductor substrate. The isolation structure includes: a polycrystalline isolation layer under the active device, a trench isolation adjacent the active device, and a porous semiconductor layer between the trench isolation and the bulk semiconductor substrate.

20 Claims, 5 Drawing Sheets

(51) Int. Cl.
    *H01L 27/088*     (2006.01)
    *H01L 27/12*     (2006.01)

(58) Field of Classification Search
    CPC ....... H01L 21/76–765; H01L 21/76205–7621; H01L 21/76224–76237; H01L 21/76283–76286; H01L 21/823493; H01L 21/8238–823892; H01L 2027/11829–11833; H01L 2027/1189–1189
    See application file for complete search history.

(56) References Cited

U.S. PATENT DOCUMENTS

| | | | |
|---|---|---|---|
| 6,683,367 | B1 | 1/2004 | Stalmans et al. |
| 6,774,435 | B1 | 8/2004 | Matsumoto et al. |
| 7,772,082 | B2 | 8/2010 | Choi |
| 7,772,083 | B2 | 8/2010 | Botula et al. |
| 8,089,126 | B2 | 1/2012 | Botula et al. |
| 10,755,987 | B2 | 8/2020 | Mason et al. |
| 10,790,170 | B2 | 9/2020 | Reber et al. |
| 10,796,942 | B2 | 10/2020 | Mariani et al. |
| 11,322,387 | B1 | 5/2022 | Rana et al. |
| 2008/0224253 | A1* | 9/2008 | Sagae ............... H01L 21/76264 257/E23.002 |
| 2009/0140346 | A1* | 6/2009 | Edwards ......... H01L 21/823892 257/369 |
| 2013/0161757 | A1* | 6/2013 | Huang ................ H01L 27/0921 257/E21.632 |
| 2017/0317075 | A1 | 11/2017 | Arai et al. |
| 2018/0053764 | A1* | 2/2018 | Salzman ............. H01L 29/1083 |
| 2019/0295881 | A1 | 9/2019 | Shank et al. |
| 2022/0359272 | A1* | 11/2022 | Augendre ......... H01L 21/76254 |
| 2022/0384659 | A1 | 12/2022 | Stamper et al. |

OTHER PUBLICATIONS

U.S. Appl. No. 17/069,098, entitled "Bulk Wafer Switch Isolation," filed Oct. 13, 2020.

U.S. Appl. No. 17/330,780, entitled "Field Effect Transistor," filed May 26, 2021.

Chiappini et al., "Tailored Porous silicon microparticles: fabrication and properties," Chemphyschem., 11:1029-35, Apr. 2010 (14 pages).

Gharbi et al., "Shallow trench isolation based on selective formation of oxidized porous silicon," Microelectronic Engineering, 88:1214-16, 2011 (3 pages).

Kale and Solanki, "Synthesis of Si Nanoparticles from Freestanding Porous Silicon (PS) Film Using Ultrasonication," 978-1-4244-5892-9/10, 2010 IEEE (6 pages).

Marsh, "Porous silicon a useful imperfection," Materials Today, pp. 36-41, Jan. 2001 (6 pages).

Nassiopoulou et al., "Porous Si as a substrate material for RF passive integration," 978-1-4673-4802-7/13, 2013 IEEE (5 pages).

Rack et al., "Small- and Large-Signal Performance up to 175 of Low-Cost Porous Silicon Substrate for RF Applications," IEEE Transactions on Electron Devices, 65:1887-95, May 2018 (9 pages).

Extended European Search Report from European Patent Application No. 22201489.6 dated Apr. 26, 2023, 6 pages.

U.S. Appl. No. 17/069,098, Notice of Allowance dated Jan. 26, 2022, 7 pages.

U.S. Appl. No. 17/069,098, Office Action dated Sep. 1, 2021, 9 pages.

U.S. Appl. No. 17/069,098, Response to Office Action filed Nov. 29, 2021, 10 pages.

U.S. Appl. No. 17/330,780, Final Office Action dated Apr. 18, 2023, 10 pages.

U.S. Appl. No. 17/330,780, Office Action dated Nov. 2, 2022, 10 pages.

U.S. Appl. No. 17/330,780, Response to Final Office Action filed Jun. 2, 2023, 12 pages.

U.S. Appl. No. 17/330,780, Response to Office Action filed Jan. 31, 2023, 12 pages.

U.S. Appl. No. 17/330,780, Office Action dated Nov. 16, 2023, 9 pages.

U.S. Appl. No. 17/330,780, Response to Office Action filed Feb. 13, 2024, 13 pages.

* cited by examiner

IC STRUCTURE INCLUDING POROUS SEMICONDUCTOR LAYER UNDER TRENCH ISOLATION

BACKGROUND

The present disclosure relates to integrated circuit (IC) structures, and more specifically, to an IC structure, such as a radio frequency switch, including an active device and a porous semiconductor layer under a trench isolation to provide additional isolation for the active device.

In integrated circuit (IC) structures, active devices are electrically isolated by dielectrics. The dielectrics may be provided in a number of locations. Dielectric trench isolations typically laterally isolate active devices. In radio frequency (RF) device applications such as switches, power amplifiers and other devices, additional isolation layers to reduce harmonics and parasitic losses are advantageous. One current approach uses a semiconductor-on-insulator (SOI) substrate with a trap-rich, high resistivity polycrystalline isolation layer between the buried insulator and the semiconductor substrate. The high resistivity, polycrystalline isolation layer is located below the RF active devices and provides additional isolation to the devices. This approach works well for SOI substrates. However, bulk semiconductor substrates including a high resistivity, polycrystalline isolation layer exhibit higher harmonics and substrate leakage current than SOI substrates.

SUMMARY

An aspect of the disclosure is directed to an integrated circuit (IC) structure, comprising: an active device over a bulk semiconductor substrate; and an isolation structure around the active device in the bulk semiconductor substrate, the isolation structure including: a polycrystalline isolation layer under the active device; a trench isolation adjacent the active device; and a porous semiconductor layer between the trench isolation and the bulk semiconductor substrate.

Another aspect of the disclosure includes a radio frequency (RF) switch, comprising: an active device over a bulk semiconductor substrate; and an isolation structure around the active device, the isolation structure including: a polycrystalline isolation layer between the active device and the bulk semiconductor substrate; a trench isolation adjacent the active device; and a porous semiconductor layer between the trench isolation and the bulk semiconductor substrate.

An aspect of the disclosure related to a method, comprising: forming an active region in a bulk semiconductor substrate using a protective cap layer, the active region forming leaving an exposed region of the bulk semiconductor substrate around the active region; forming a porous semiconductor layer in the exposed region of the bulk semiconductor substrate around the active region; forming an insulator over the porous semiconductor layer to create a trench isolation over the porous semiconductor layer; forming a polycrystalline isolation layer below the active region; and forming an active device in the active region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
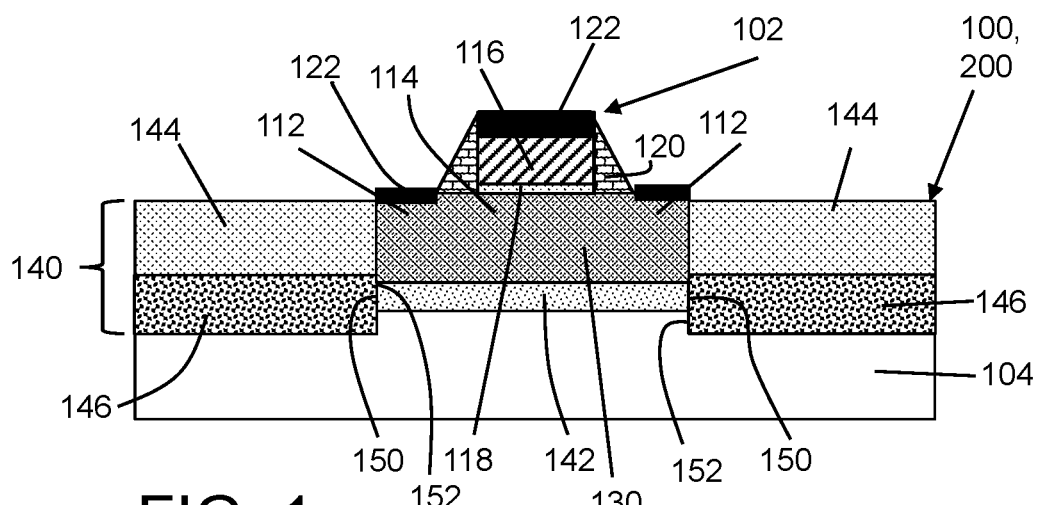
FIG. 1 shows a cross-sectional view of an integrated circuit (IC) structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure including an active device over a bulk semiconductor substrate, and an isolation structure around the active device in the bulk semiconductor substrate. The isolation structure includes: a polycrystalline isolation layer under the active device, a trench isolation adjacent the active device, and a porous semiconductor layer between the trench isolation and the bulk semiconductor substrate. The IC structure employs a lower cost, low resistivity bulk semiconductor substrate rather than a semiconductor-on-insulator (SOI) substrate, yet it has better performance characteristics for radio frequency (RF) devices than an SOI substrate. For example, the IC structure with the porous semiconductor under the trench isolation exhibits better current leakage, harmonic distortion, cross-talk resistance, effective resistivity, effective permittivity, and attenuation, compared to current SOI substrate devices.

FIG. 1 shows a cross-sectional view of an IC structure 100, according to embodiments of the disclosure. IC structure 100 includes an active device 102 over a bulk semiconductor substrate 104. Bulk semiconductor substrate 104 includes a low resistivity semiconductor material, which is relatively inexpensive to produce compared to a higher resistivity SOI substrate. Bulk semiconductor substrate 104 may include any semiconductor material that can be made porous, as described herein, including but not limited to silicon. Bulk semiconductor substrate 104 is monocrystalline. A portion of or entirety of bulk semiconductor substrate 104 may be strained.

Active device 102 may include any now known or later developed transistor. IC structure 100 may have a wide number of applications. For example, as noted herein, it finds advantageous application as a radio frequency (RF) switch. Active device 102 may include, for example, source/drain regions 112, a channel region 114, a gate 116, a gate dielectric layer 118 between gate 116 and channel region 114, and a gate spacer 120 about gate 116. Source/drain regions 112 may include any appropriate dopant within semiconductor substrate 104. Gate 116 may be a metal or polysilicon gate and may include one or more conductive components for providing a gate terminal of a transistor. For example, metal gates 116 may include a high dielectric constant (high-K) layer, a work function metal layer and a gate conductor (none shown for clarity). A gate cap (not shown) may also be formed over gate 116.

Gate dielectric layer 118 may include any now known or later developed gate dielectric materials such as but not limited to hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. Spacer 120 may include any now known or later developed spacer material such as silicon nitride. Silicidation 122 for contacts (not shown) may be provided to source/drain regions 112 and gate 116.

In certain embodiments, active device 102 may include an epitaxial region 130 in which source/drain regions 112 are formed. Epitaxial region 130 has a resistivity higher than bulk semiconductor substrate 104. In one example, bulk semiconductor substrate 104 may have a resistivity of less than 4 Ohms per square centimeter (Ω/cm$^2$), and epitaxial region 130 may have a resistivity of greater than 1000 Ω/cm$^2$. The terms "epitaxial" and "epitaxially formed and/or grown" means the growth of a semiconductor material on a deposition surface of bulk semiconductor substrate 104 may have the same crystalline characteristics as the semiconductor material of the deposition surface.

IC structure 100 also includes an isolation structure 140 around active device 102 in bulk semiconductor substrate 104. Isolation structure 140 may include a polycrystalline isolation layer 142 under active device 102. As illustrated, epitaxial region 130, where provided, is over polycrystalline isolation layer 142. As will be described herein, polycrystalline isolation layer 142 may be formed by implanting a noble gas ions into bulk semiconductor substrate 104, and annealing. In one example, bulk semiconductor substrate 104 may have a resistivity of less than 4 Ω/cm$^2$, and polycrystalline isolation layer 142 (and epitaxial region 130) may have a resistivity of greater than 1000 Ω/cm$^2$. Hence, polycrystalline isolation layer 142 exhibits a high resistance compared to bulk semiconductor substrate 104, and thus acts to electrically isolate an underside of active device 102

Isolation structure 140 also includes a trench isolation 144 adjacent active device 102. Trench isolations (TI) 144 typically include a trench etched into bulk semiconductor substrate 104 and filled with an insulator, to isolate one region of the substrate from an adjacent region of the substrate. As will be described, prior to forming TI 144, a porous semiconductor layer 146 is formed so it is under TI 144. Each TI 144 may be formed of electrical insulation material(s), and as examples may include: silicon nitride (Si$_3$N$_4$), silicon oxide (SiO$_2$), fluorinated SiO$_2$ (FSG), hydrogenated silicon oxycarbide (SiCOH), boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI 144 may be provided as a shallow trench isolation (STI) (shown) or a deep trench isolation (DTI). In any event, TI 144 surrounds active device 102.

Isolation structure 140 also includes a porous semiconductor layer 146 between TI 144 and bulk semiconductor substrate 104. Porous semiconductor layer 146 provides additional resistance to electrically isolate active device 102 from bulk semiconductor substrate 104. Porous semiconductor layer 146 allows IC structure 100 to have electrical isolation that is as good as or better than IC structures built on more expensive, high resistivity SOI substrates. Porous semiconductor layer 146 may include the same material as bulk semiconductor substrate 104, but made porous as described herein. In one example, porous semiconductor layer 146 and bulk semiconductor substrate 104 may include silicon (Si). In one example, porous semiconductor layer 146 has a depth of between 100 nm to 10 micrometers (μm) below TI 144. In some conventional applications, porous silicon has been used as a trench isolation. However, according to embodiments of the disclosure, TI 144 and porous semiconductor layer 146 do not include the same material.

Polycrystalline isolation layer 142 does not extend under TI 144. In the FIG. 1 example, polycrystalline isolation layer 142 may include an endwall 150 contacting at least one of trench isolation 144 and porous semiconductor layer 146, e.g., depending on a vertical positioning and/or depth of polycrystalline isolation layer 142 and/or epitaxial region 130. Similarly, porous semiconductor layer 146 may include a sidewall 152 in contact with polycrystalline isolation layer 142 and bulk semiconductor substrate 104.

Isolation structure 140 thus includes polycrystalline isolation layer 142 under active device 102. Isolation structure 140 also includes TI 144, and includes porous semiconductor layer 146 between TI 144 and bulk semiconductor substrate 104. TI 144 and porous semiconductor layer 146 are to the side or adjacent to active device 102. TI 144 does not include the same material as porous semiconductor layer 146, e.g., TI 144 may include silicon oxide where porous semiconductor layer 146 includes oxidized porous silicon.

Figure 2:
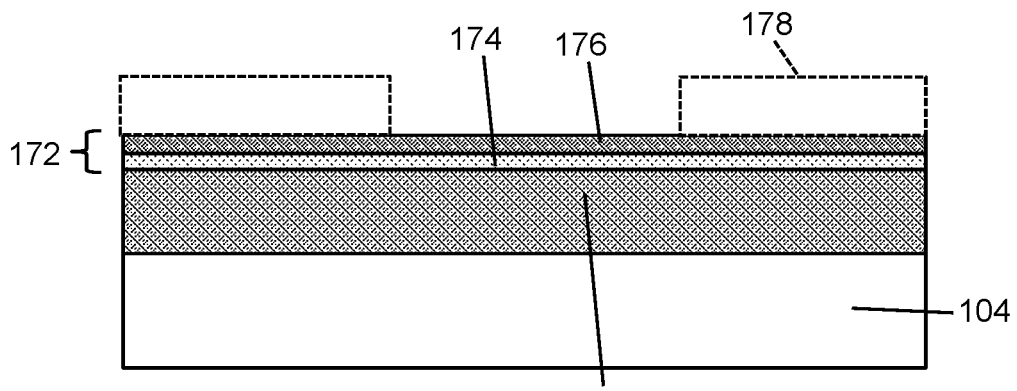
FIGS. 2-8 show cross-sectional views of a method of forming the IC structure, according to embodiments of the disclosure.
Figure 3:
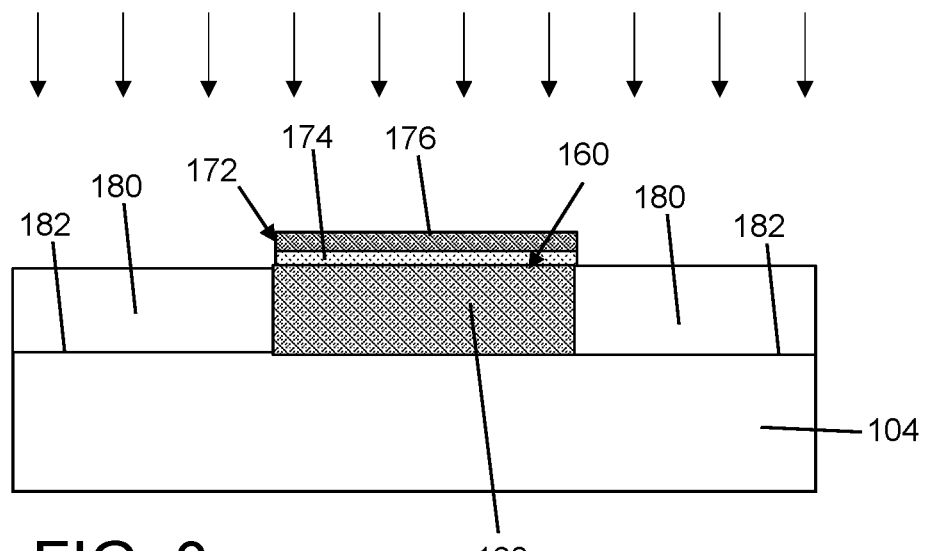

Referring to FIGS. 2-8, cross-sectional views of one embodiment of a method of forming IC structure 100 are shown. FIGS. 2-3 show forming an active region 160 (FIG. 3) in bulk semiconductor substrate 104 using a protective cap layer 172. In the example shown in FIG. 2, forming active region 160 includes forming epitaxial region 130 having a resistivity higher than bulk semiconductor substrate 104. Epitaxial region 130 is formed in or on bulk semiconductor substrate 104, e.g., by epitaxial growth. As noted, bulk semiconductor substrate 104 may have a resistivity of less than approximately 4.0 $\Omega/cm^2$, and epitaxial region 130 may have a resistivity of greater than approximately 1000 $\Omega/cm^2$.

FIG. 2 also shows formation of a protective cap layer 172. In the example shown, protective cap layer 172 includes a number of sub-layers 174, 176 of, for example, oxide in sub-layer 174 and nitride in sub-layer 176; however, other materials are also possible. Protective cap layer 172 may be formed by any appropriate deposition technique(s) for the material formed, e.g., chemical vapor deposition (CVD), atomic layer deposition (ALD), among others. A mask 178 may be used to pattern active region 160 (FIG. 3), e.g., by etching. Mask 178 may include any appropriate mask material for the etching process and material (e.g., silicon) to be etched. Any appropriate etching process may be used, e.g., a RIE or wet etch. As shown in FIG. 3, the etching (arrows) creates an opening 180 about active region 160, and leaves an exposed region 182 of bulk semiconductor substrate 104 around active region 160. At this stage, mask 164 can be removed using any appropriate technique, e.g., an ashing process.

Figure 4:
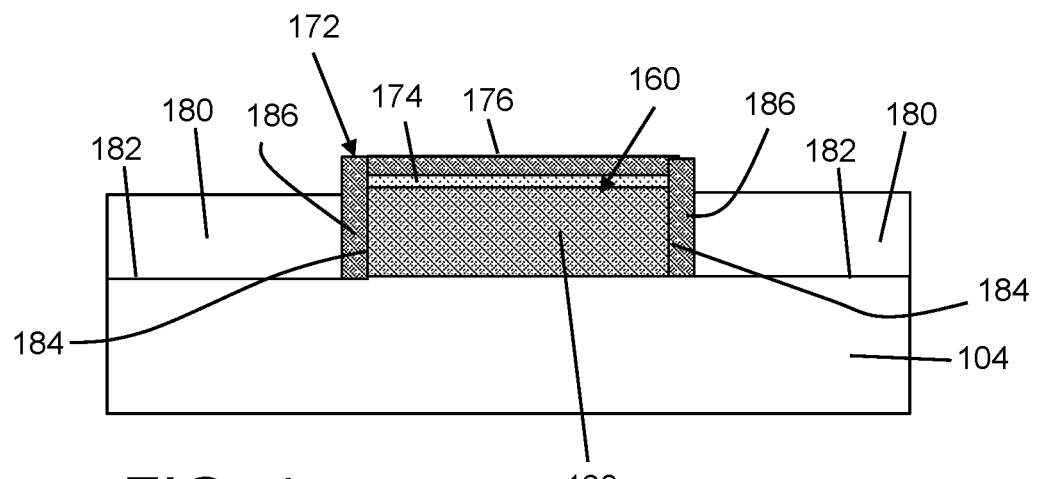

FIG. 4 shows an optional step of (additionally) forming protective cap layer 172 along a sidewall 184 of active region 160. Portions 186 of protective cap layer 172 on sidewall 184 of active region 160. In the example shown, a single nitride layer is used; however, a variety of materials and any number of layers may be used. Portions 186 of protective cap layer 172 provide additional protection of active region 160 (i.e., epitaxial region 130) during subsequent formation of porous semiconductor layer 146 (FIG. 6). It is noted, however, that portion 186 of protective layer 172 is not necessary because the processing (FIGS. 5-6) to form porous semiconductor layer 146 may be made selective to bulk semiconductor substrate 104. That is, epitaxial region 130 is immune to the processing.

Figure 5:
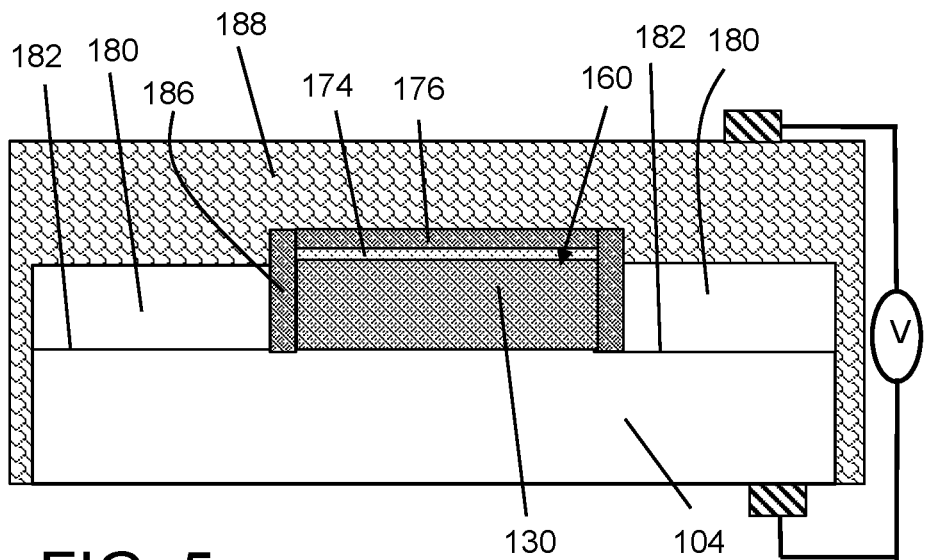
Figure 6:
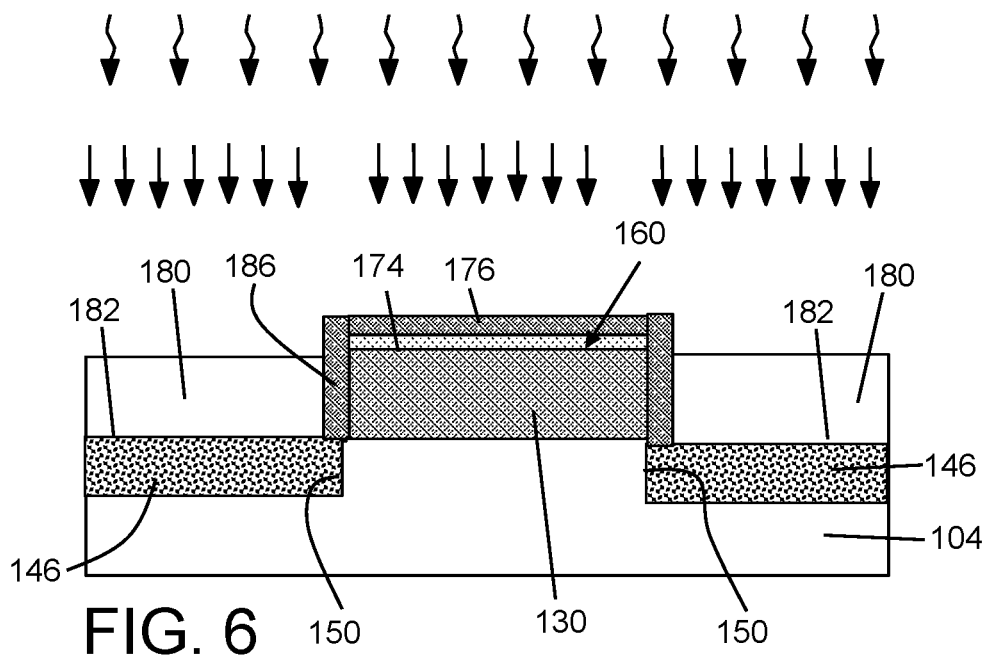

FIGS. 5-6 show forming a porous semiconductor layer 146 in exposed region 182 of bulk semiconductor substrate 104 around active region 160. The porous layer forming may include, as shown in FIG. 5, exposing exposed region 182 to an electrolyte solution 188, and applying a voltage (V) across bulk semiconductor substrate 104. While a variety of techniques are possible, in one example, electrolyte solution 188 may include hydrofluoric (HF) acid that etches the semiconductor material and makes it porous. Other techniques for forming a porous semiconductor layer are known, and thus no additional details are necessary. A depth and width of porous semiconductor layer 146 can be controlled by, for example, the duration of electrolyte solution 188 application, the electrolyte material and concentration, and the voltage applied. In one example, porous semiconductor layer 146 (FIG. 6) may have a depth of between about 100 nanometers (nm) to 10 micrometers (µm) below opening 180. As illustrated in FIG. 6, porous semiconductor layer 146 may include endwall 150 in contact with bulk semiconductor substrate 104. Hence, porous semiconductor layer 146 does not constitute an entirety of substrate 104 nor does it extend along an entire length of substrate 104. At this stage, protective cap layer 172, including portions 186 if provided, can be removed using any appropriate technique, e.g., a selective etch.

Figure 7:
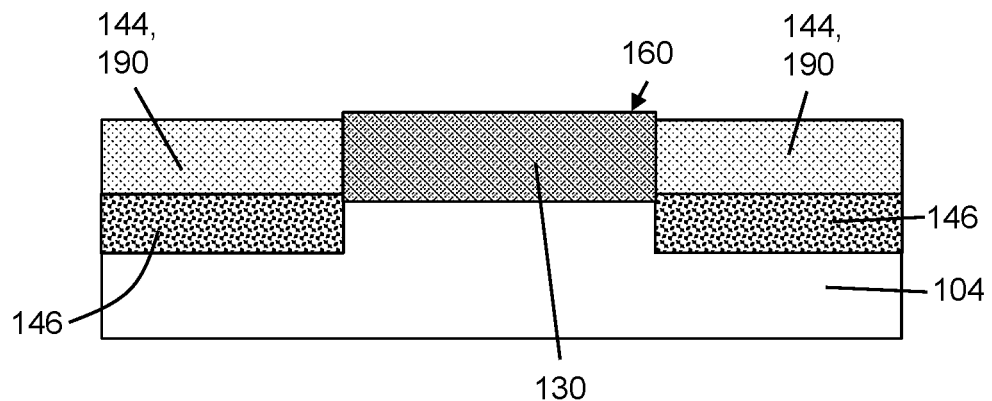

FIG. 7 shows forming an insulator 190 over porous semiconductor layer 146 to create TI 144 over porous semiconductor layer 146. Insulator 190 may include any of the materials listed herein for TI 144, e.g., silicon oxide, and may be formed by any appropriate deposition technique, e.g., CVD, ALD, among others. Any necessary planarization step may then occur, e.g., chemical mechanical planarization, to remove any excess insulator 190.

Figure 8:
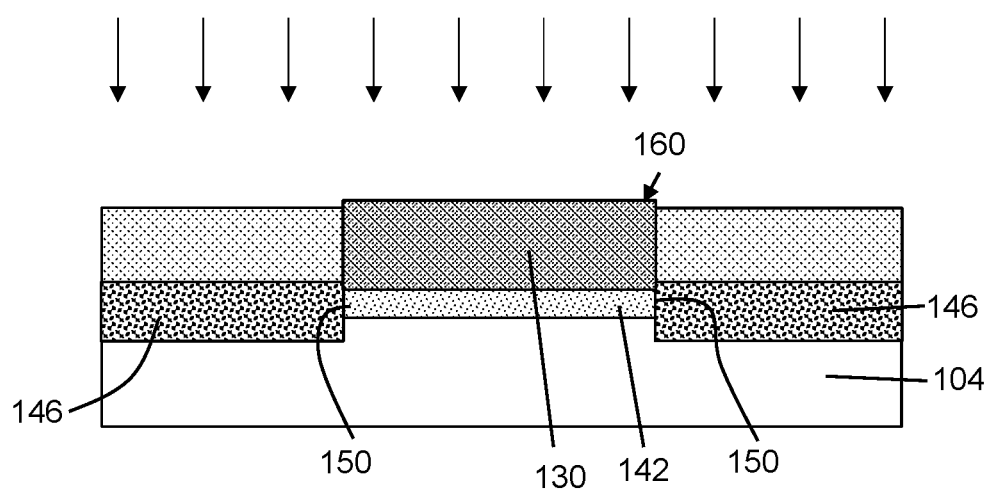

FIG. 8 shows forming a polycrystalline isolation layer 142 below active region 160. Polycrystalline isolation layer 142 may be formed, for example, by doping an area under active region 160. There are a number of ways to dope the desired area to form polycrystalline isolation layer 142. In one example, the process may include implanting a dopant (straight arrows in FIG. 8) into active region 160, and potentially other areas of semiconductor substrate 104, not shown. As illustrated, the dopant is implanted into monocrystalline semiconductor substrate 104. Implanting or doping is the process of introducing impurities (dopants) into a material. An ion implanter is typically employed for the actual implantation. An inert carrier gas such as nitrogen is usually used to bring in the impurity source (dopant). A dosage and an energy level appropriate for the particular bulk semiconductor substrate 104 and desired doping may be specified and/or a resulting doping level may be specified. An example of doping is implanting with argon (Ar) with a dosage of between about 1E12 and 1E13 atoms/$cm^2$, and an energy of about 40 to 80 keV to produce a doping level of between 1E17 and 1E18 atoms/$cm^3$. In this case, as shown in FIG. 8, the doping is carried out to damage the monocrystalline material to which it is applied.

FIG. 8 also shows one or more thermal cycle(s), e.g., an anneal indicated by curved arrows, that re-orders the damaged and disordered crystallographic material into polycrystalline material. The thermal cycle(s) may include one or more intentionally added recrystallization anneal(s) shortly after implant, or the normal high temperature (>600° C.) process(es) associated with semiconductor manufacturing. In this manner, the process converts monocrystalline bulk semiconductor substrate 104 (under epitaxial region 130, if provided) to polycrystalline isolation region 142. The dopant implanted may be include any material capable of creating polycrystalline material including but not limited to: germanium (Ge); a noble gas such as argon (Ar) or xenon (Xe); or a combination of the previously listed materials such as Ge—Ar or Ge—Xe. The vertical location at which polycrystalline isolation layer 142 starts and the depth of layer 142 can be controlled by the duration and energy of the ion implanting used. As noted, endwall 150 of porous semiconductor layer 146 may be in contact with polycrystalline isolation layer 142 and bulk semiconductor substrate 104. Polycrystalline isolation layer 142 does not extend under TI 144. In an alternative embodiment, polycrystalline isolation layer 142 may be formed in bulk semiconductor substrate 104 prior to epitaxial region 130, and epitaxial region 130 may be formed thereover. In any event, polycrystalline isolation layer 142 may have a resistivity of, for example, greater than 1000 $\Omega/cm^2$, providing relatively strong resistance to current leakage from under active device 102.

Figure 9:
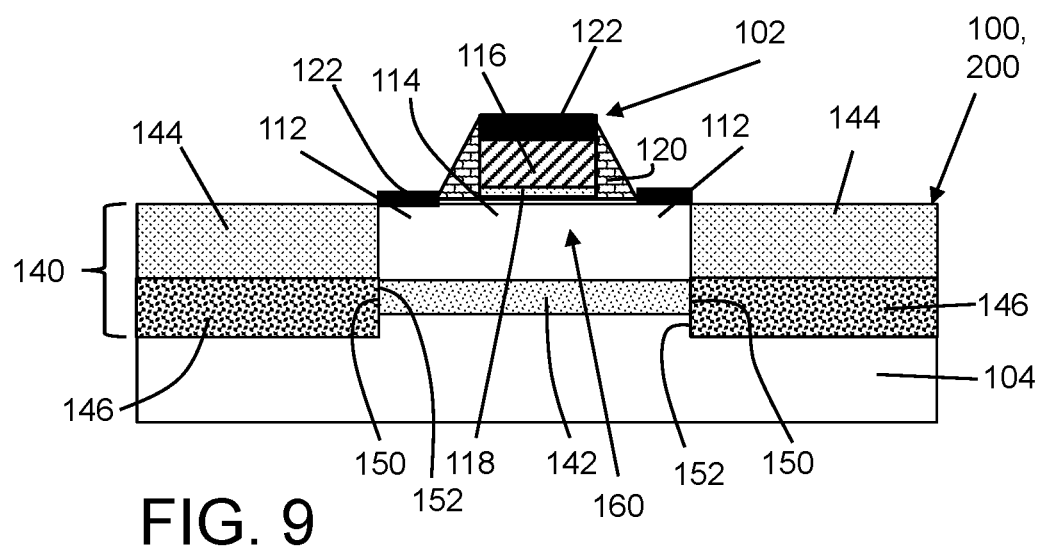
FIG. 9 shows a cross-sectional view of an IC structure, according to an alternative embodiment of the disclosure.

Returning to FIG. 1, forming an active device 102 in active region 160 is illustrated. Active device 102 may be formed using any now known or later developed semiconductor fabrication techniques, the options of which are well known and will not be described in detail. FIG. 9 shows forming active device 102 in an active region 160 that does not include epitaxial region 130 (FIG. 1). In any event, isolation structure 140 is around active region 160 in bulk semiconductor substrate 104 and electrically isolates active device 102. Isolation structure 140 may include polycrystalline isolation layer 142 under active device 102, TI 144 adjacent active device 102, and porous semiconductor (e.g., silicon) layer 146 between TI 144 and bulk semiconductor substrate 104.

Embodiments of the disclosure provide IC structure 100 that uses a lower cost, low resistivity bulk semiconductor substrate 104 rather than a more expensive, higher resistivity SOI substrate. Despite the lower cost substrate, IC structure 100 with isolation structure 140 has better performance characteristics than a device in an SOI substrate, e.g., for radio frequency (RF) switches. For example, IC structure 100 exhibits better current leakage, harmonic distortion, cross-talk resistance, effective resistivity, effective permittivity, and attenuation, compared to current SOI substrate devices. One example SOI n-type field effect (NFET) RF switch that includes a high resistivity polycrystalline isolation layer exhibits an 'under trench isolation' resistance of about 1E6Ω, and a leakage current of approximate 10 micro-Amperes (μA). In contrast, a similar NFET RF switch 200 employing IC structure 100 according to embodiments of the disclosure may exhibit an under trench isolation of about 300-400 nanometers (nm), and a leakage current of less than 1 μA. Other operational parameters exhibit similar improvements.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   an active device over a bulk semiconductor substrate, the active device including:
   an epitaxial region under a gate structure, wherein the epitaxial region includes a lower surface; and
   an isolation structure around the active device in the bulk semiconductor substrate, the isolation structure including:
   a polycrystalline isolation layer under the epitaxial region, wherein the polycrystalline isolation layer includes an upper surface contacting the lower surface of the epitaxial region;
   a trench isolation adjacent to the active device; and
   a porous semiconductor layer between the trench isolation and the bulk semiconductor substrate, wherein the epitaxial region includes an endwall contacting both the trench isolation and the porous semiconductor layer.

2. The IC structure of claim 1, wherein the epitaxial region has a resistivity higher than the bulk semiconductor substrate.

3. The IC structure of claim 2, wherein the bulk semiconductor substrate has a resistivity of less than 4 Ohms per square centimeter ($\Omega/cm^2$), and the epitaxial region and the polycrystalline isolation layer have a resistivity of greater than 1000 $\Omega/cm^2$.

4. The IC structure of claim 1, wherein the active device includes a radio frequency (RF) switch.

5. The IC structure of claim 1, wherein the polycrystalline isolation layer includes an endwall contacting the porous semiconductor layer.

6. The IC structure of claim 1, wherein the porous semiconductor layer includes a sidewall in contact with the epitaxial region, the polycrystalline isolation layer, and the bulk semiconductor substrate.

7. The IC structure of claim 1, wherein the porous semiconductor layer and the bulk semiconductor substrate include silicon.

8. The IC structure of claim 1, wherein the porous semiconductor layer has a depth of between 100 nanometers (nm) to 10 micrometers (μm).

9. A radio frequency (RF) switch, comprising:
   an active device over a bulk semiconductor substrate, the active device including:
   an epitaxial region under a gate structure, wherein the epitaxial region includes a lower surface; and
   an isolation structure around the active device, the isolation structure including:
   a polycrystalline isolation layer under the epitaxial region, wherein the polycrystalline isolation layer includes an upper surface contacting the lower surface of the epitaxial region;
   a trench isolation adjacent to the active device; and
   a porous semiconductor layer between the trench isolation and the bulk semiconductor substrate, wherein the epitaxial region includes an endwall contacting both the trench isolation and the porous semiconductor layer.

10. The RF switch of claim 9, wherein the epitaxial region has a resistivity higher than the bulk semiconductor substrate.

11. The RF switch of claim 10, wherein the bulk semiconductor substrate has a resistivity of less than 4 Ohms per square centimeter ($\Omega/cm^2$), and the epitaxial region and the polycrystalline isolation layer have a resistivity of greater than 1000 $\Omega/cm^2$.

12. The RF switch of claim 9, wherein the polycrystalline isolation layer includes an endwall contacting the porous semiconductor layer.

13. The RF switch of claim 9, wherein the porous semiconductor layer includes a sidewall in contact with the epitaxial region, the polycrystalline isolation layer, and the bulk semiconductor substrate.

14. The RF switch of claim 9, wherein the porous semiconductor layer has a depth of between 100 nanometers (nm) to 10 micrometers (μm).

15. A method, comprising:
   forming an active region in a bulk semiconductor substrate using a protective cap layer, the active region forming leaving an exposed region of the bulk semiconductor substrate around the active region;
   forming an epitaxial region under a gate structure, wherein the epitaxial region includes a lower surface;
   forming a porous semiconductor layer in the exposed region of the bulk semiconductor substrate around the active region;
   forming an insulator over the porous semiconductor layer to create a trench isolation over the porous semiconductor layer, wherein the porous semiconductor layer is formed between the trench isolation and the bulk semiconductor substrate, and wherein the epitaxial region includes an endwall contacting both the trench isolation and the porous semiconductor layer;
   forming a polycrystalline isolation layer below the epitaxial region, wherein the polycrystalline isolation layer includes an upper surface contacting the lower surface of the epitaxial region; and
   forming an active device in the active region.

16. The method of claim 15, wherein the epitaxial region has a resistivity higher than the bulk semiconductor substrate.

17. The method of claim 16, wherein the bulk semiconductor substrate has a resistivity of less than 4 Ohms per square centimeter ($\Omega/cm^2$), and the epitaxial region and the polycrystalline isolation layer have a resistivity of greater than 1000 $\Omega/cm^2$.

18. The method of claim 15, wherein forming the protective cap layer over the active region includes forming the protective cap layer along a sidewall of the active region.

19. The method of claim 15, wherein forming the porous semiconductor layer in the exposed region of the bulk semiconductor substrate includes: exposing the exposed region of the bulk semiconductor substrate to an electrolyte solution; and applying a voltage across the bulk semiconductor substrate.

20. The method of claim 15, wherein the porous semiconductor layer includes a sidewall in contact with the polycrystalline isolation layer and the bulk semiconductor substrate, and the porous semiconductor layer has a depth of between 100 nanometers (nm) to 10 micrometers (μm).

\* \* \* \* \*